United States Patent
Misumi (10) Patent No.: US 7,808,837 B2
(45) Date of Patent: Oct. 5, 2010

(54) NON-VOLATILE MEMORY CONTROL DEVICE

(75) Inventor: Kenji Misumi, Kyoto (JP)

(73) Assignee: Panasonic Corporation, Osaka (JP)

( * ) Notice: Subject to any disclaimer, the term of this patent is extended or adjusted under 35 U.S.C. 154(b) by 159 days.

(21) Appl. No.: 12/182,782

(22) Filed: Jul. 30, 2008

(65) Prior Publication Data

US 2009/0034340 A1   Feb. 5, 2009

(30) Foreign Application Priority Data

Jul. 30, 2007   (JP)   .............................. 2007-196940

(51) Int. Cl.
*G11C 11/34*   (2006.01)
*G11C 16/04*   (2006.01)
*G11C 7/00*   (2006.01)

(52) U.S. Cl. .............................. 365/185.28; 365/189.16; 365/191; 365/196

(58) Field of Classification Search ............ 365/185.28, 365/189.16, 191, 196
See application file for complete search history.

(56) References Cited

U.S. PATENT DOCUMENTS

| 5,555,204 A | 9/1996 | Endoh et al. |
| 6,091,640 A | 7/2000 | Kawahara et al. |
| 6,999,349 B2 | 2/2006 | Misumi et al. |
| 2004/0165445 A1 | 8/2004 | Misumi et al. |
| 2006/0023514 A1 | 2/2006 | Misumi et al. |
| 2006/0285391 A1* | 12/2006 | Cernea .................. 365/185.22 |
| 2007/0159871 A1* | 7/2007 | Osada et al. ................. 365/148 |
| 2008/0123409 A1* | 5/2008 | Shirakawa ............. 365/185.03 |
| 2008/0239823 A1* | 10/2008 | Hebishima ............. 365/185.18 |

FOREIGN PATENT DOCUMENTS

JP   2004-253093   9/2004

* cited by examiner

*Primary Examiner*—Ly D Pham
(74) *Attorney, Agent, or Firm*—McDermott Will & Emery LLP

(57) ABSTRACT

A memory controller outputs an additional writing instruction to one of a plurality of non-volatile memories arbitrarily selected via a writing instruction output unit when a signal which rejects a writing operation is not outputted from writing controllers of the plurality of non-volatile memories for a certain period of time, and outputs a temporary writing instruction to another non-volatile memory at least once via the writing instruction output unit by the time when the additional writing operation is completed in the arbitrary non-volatile memory.

3 Claims, 11 Drawing Sheets

NON-VOLATILE MEMORY CONTROL DEVICE

BACKGROUND OF THE INVENTION

1. Field of the Invention

The present invention relates to a device for controlling a non-volatile memory in which data can be electrically written and erased, more particularly to a technology for reducing an amount of time which is apparently necessary for writing data from a memory controller in the non-volatile memory.

2. Description of the Related Art

Figure 9:
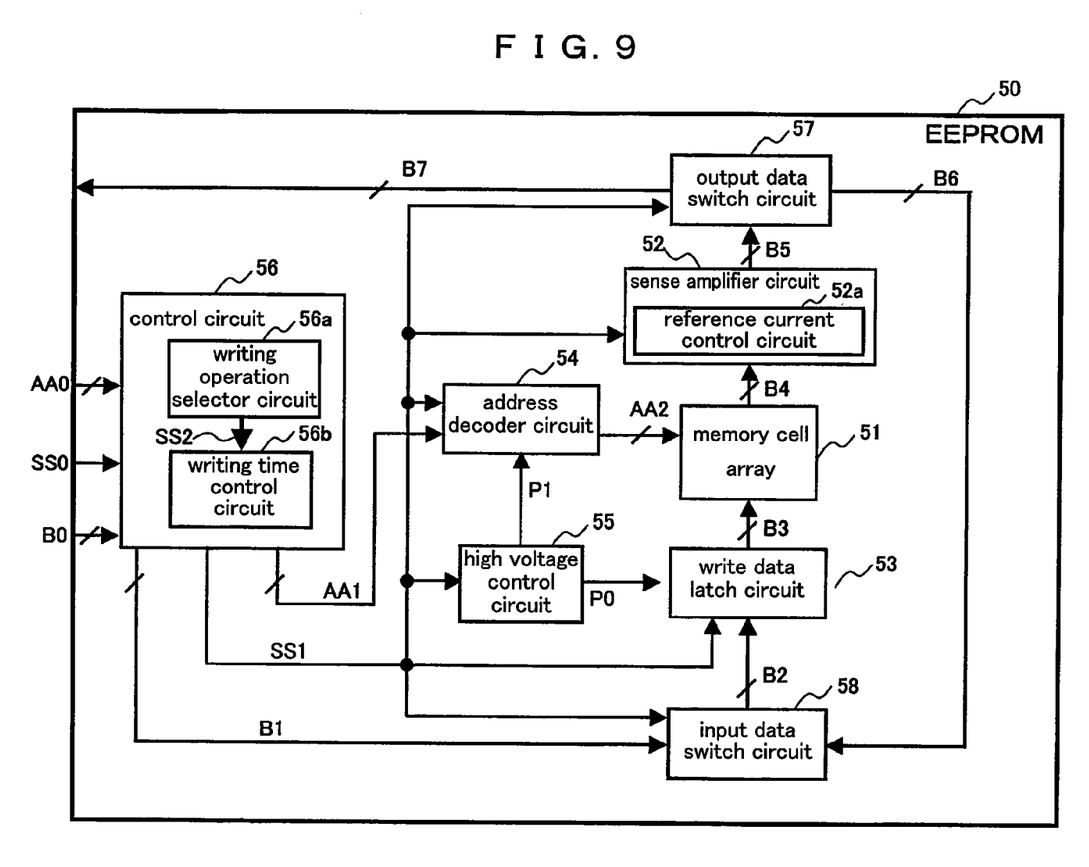
FIG. 9 is a block diagram illustrating a constitution of a conventional non-volatile memory control device.
Figure 10A:
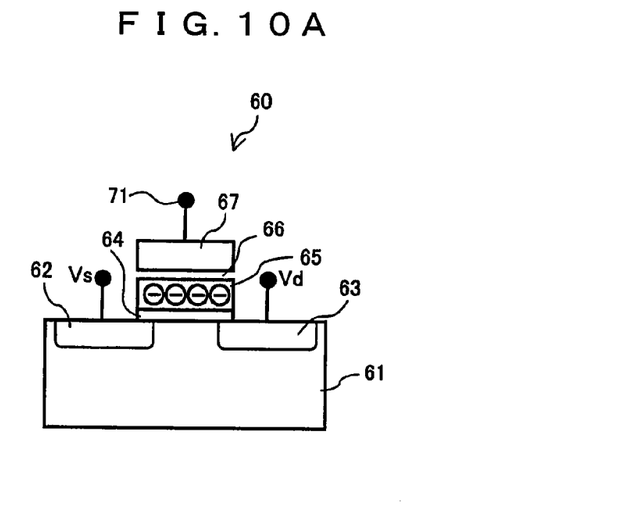
FIG. 10A is a sectional view of a floating-gate memory cell transistor.
Figure 10B:
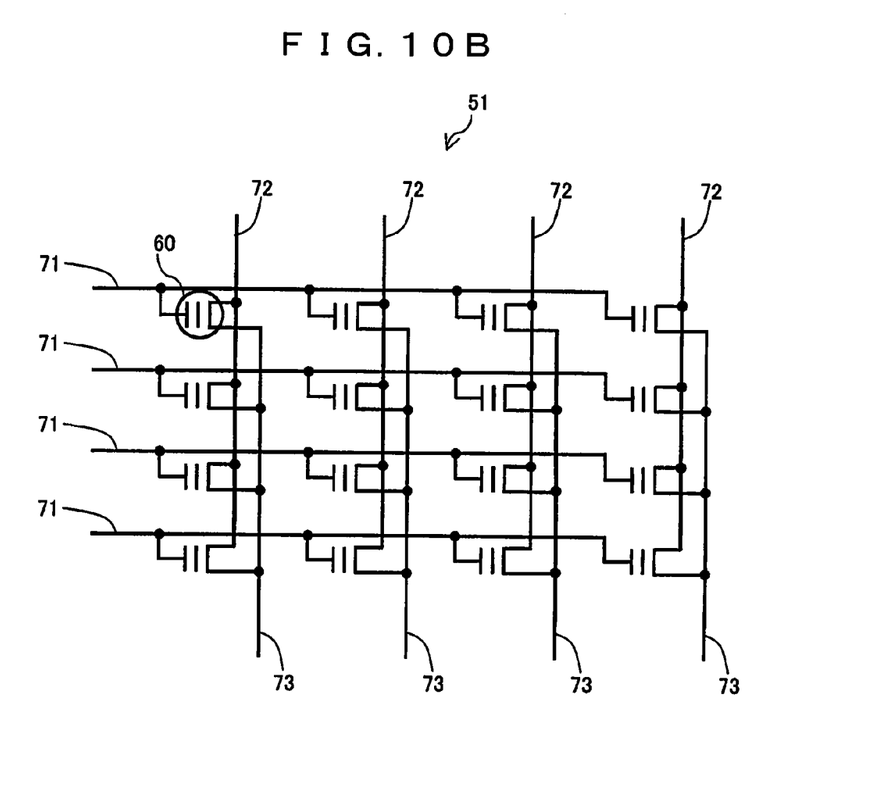
FIG. 10B is an illustration of a constitution of a memory cell array.
Figure 11A:
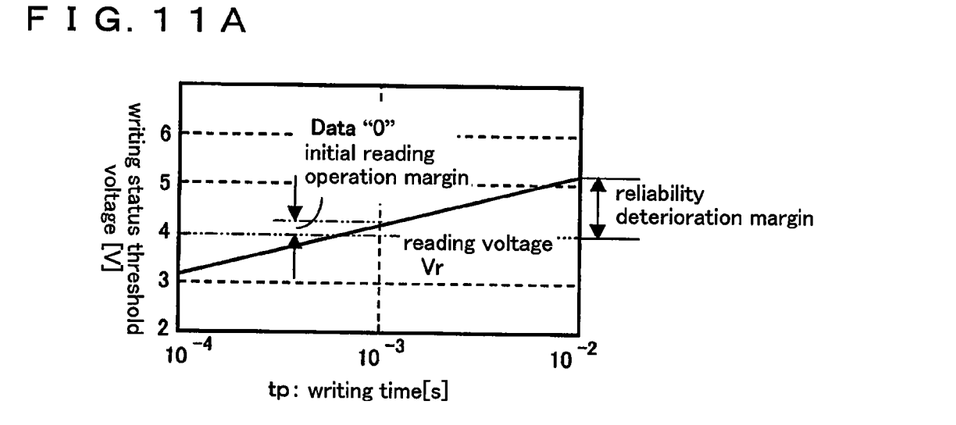
FIG. 11A is an illustration of a writing-time dependency of a writing-status threshold voltage according to the conventional technology.
Figure 11B:
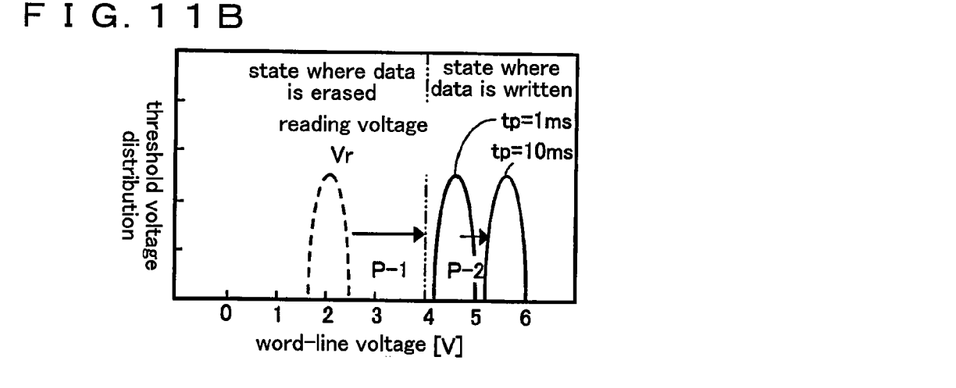
FIG. 11B is an illustration of a threshold voltage distribution.
Figure 11C:
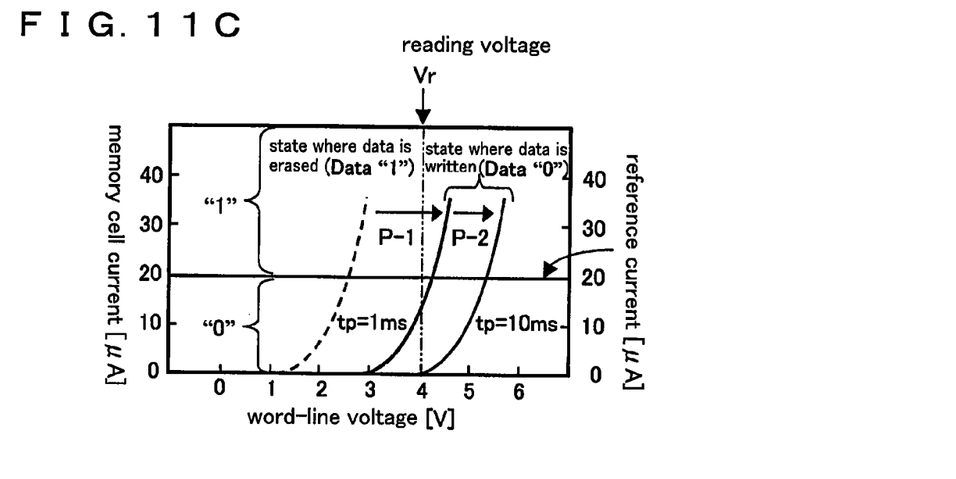
FIG. 11C is an illustration of a word-line-voltage dependency of a memory-cell current.

A conventional non-volatile memory control device, which is recited in the Japanese Patent Publication (No. 2004-253093 of the Japanese Patent Applications Laid-Open) is described referring to FIGS. 9-11C. FIG. 9 is a block diagram illustrating a constitution of a conventional EEPROM (Electrically Erasable Programmable Read Only Memory), FIG. 10A is a sectional view of a floating-gate memory cell transistor of the conventional EEPROM, FIG. 10B is an illustration of a constitution of a memory cell array, FIG. 11A is an illustration of a writing-time dependency of a writing-status threshold voltage of the conventional EEPROM, and FIG. 11B is an illustration of a threshold voltage distribution, and FIG. 11C is an illustration of a word-line-voltage dependency of a memory-cell current.

As shown in FIG. 9, an EEPROM 50 comprises a memory cell array 51, a sense amplifier circuit 52, a write data latch circuit 53, an address decoder circuit 54, a high-voltage control circuit 55, and a control circuit 56. The control circuit 56 is provided with a writing operation selector circuit 56a and a writing time control circuit 56b. The EEPROM 55 further comprises an output data switch circuit 57 and an input data switch circuit 58, and an output of the output data switch circuit 57 is inputted to the input data switch circuit 58 via a write data transfer bus B6.

As shown in FIG. 10A, a source 62 and a drain 63 are formed in a substrate 61 in a memory cell transistor 60, and a floating gate 65 is formed on a tunnel oxide film 64. A control gate 67 is formed on the floating gate 65 via an ONO (Oxide-Nitride-Oxide) film 66. A word line 71 is connected to the control gate 67.

In the memory cell transistor 60, a high electrical field is applied to the tunnel oxide film 64 so that a tunnel current is generated, and electrons stored in the floating gate 65 are thereby withdrawn or injected. As a result, a threshold voltage of the memory cell is controlled, and the data can be accordingly written and erased.

As shown in FIG. 10B, in the memory cell array 51, the memory cell transistors 60 are provided in a matrix shape at points at which a plurality of word lines 71 and a plurality of bit lines 72 respectively intersect with each other. Sources of the memory cell transistors 60 are respectively connected to source lines 73.

Next, an operation of the EEPROM thus constituted is described. When a writing instruction is issued, a temporary writing operation, in which the data is written at a high speed, is performed, and an additional writing operation, in which the reliability of the data writing is assured, is then performed. When the temporary writing operation and the additional writing operation are thus combined, the reduction of the writing time and the assurance of the reliability can be both realized. Below is given a more detailed description.

First, a temporary writing operation is executed to the EEPROM 50. In the temporary writing operation, the writing operation selector circuit 56a in the control circuit 56 selects the temporary writing operation in accordance with an input signal SS0, which is the writing instruction supplied from the memory controller not shown, and the writing time control circuit 56b sets a predetermined writing time. The predetermined writing time is a minimal amount of time demanded so that an initial reading operation, which is necessary for the additional writing operation described later, can be normally executed. For example, a writing time tp for this purpose is 1 ms, as illustrated in FIGS. 11A-11C, and is such a short period of time that stays in a single-digit number in comparison to a normal writing time of a two-digit number which guarantees the reliability (for example, tp=10 ms).

The high voltage control circuit 55 receives a control signal SS1 for the writing operation from the control circuit 56 and generates a high-voltage which is necessary for the writing operation, and supplies the generated high voltage to the write data latch circuit 53 and the address decoder circuit 54. The data to be written supplied via data buses B0 and B1 is retained in the write data latch circuit 53 via the input data switch circuit 58 and a write data bus B2. The write data latch circuit 53 and the address decoder circuit 54 supply the high voltage which is necessary for the writing operation to an address in the memory cell array 51 at which the data is written. The high voltage is supplied during a period of time set by the writing time control circuit 56b, and the temporary writing operation is thereby executed. The temporary writing operation is executed at a high speed.

Next, the additional writing operation is described. The additional writing operation includes operations in three stages, which are a data discriminating operation, a data transfer operation and a writing operation. When the input signal SS0 including a data discriminating instruction, a data transfer instruction and a writing instruction is inputted from the memory controller, the control circuit 56 outputs the control signal SS1 to respective circuits. In the data discriminating operation, the sense amplifier circuit 52 discriminates the data temporarily written in the memory cell array 51. In the data transfer operation, the output data switch circuit 57 and the input data switch circuit 58 jointly transfer the temporarily written data to the write data latch circuit 53. In the writing operation, the data retained in the write data latch circuit 53 is written in the memory cell array 51. The respective operations are described below.

First, the data discriminating operation is described below. Current values of the memory cell transistors in the memory cell array 51 vary depending on the temporarily written data. When the data is discriminated by the sense amplifier circuit 52, therefore, a difference between the current value of the memory cell transistor and a constant reference current generated by a reference current control circuit 52a is used. More specifically, a voltage of 2 volts is applied to the word line of the memory cell transistor selected by the address decoder circuit 54 via an address bus AA2, and a voltage of 1 volt is applied to a bit line B4. A drain current flow between the bit line 72 and the source line 73 of the memory cell transistor selected at the time is inputted to the sense amplifier circuit 52 via a bit line B4. The drain current then is decided based on a word line voltage, a bit line voltage, a threshold voltage, and the like, of the selected memory cell transistor. When the output data is discriminated by the sense amplifier circuit 52, the drain current is compared to the reference current (for example, μA). In the case where the drain current is larger than the reference current, comparison data is "1". In the case where the drain current is smaller than the reference current, the comparison data is "0".

The data transfer operation is described below. The data outputted from the sense amplifier circuit 52 in the data discriminating operation is inputted to and retained in the write data latch circuit 53 via a read data transfer bus B5, output data switch circuit 57, write data transfer bus B6, input data switch circuit 58, and write data bus B2. In order to read the temporarily written data and output the read data outside from the EEPROM 50, the following operations are executed:

- the output of the control signal SS1 by the control circuit 56 in accordance with the input signal SS0 for the reading instruction from the memory controller;
- the data discrimination in a manner similar to the description earlier; and
- the read of the output data of the sense amplifier circuit 52 and the output of the read data via the data transfer bus B5, output data switch circuit 57 and data bus B7.

The writing operation is described below. The writing time control circuit 56b sets a writing time longer than that of the temporarily writing operation. The writing time is set to be long enough for the reliability in the normal operation to be guaranteed. The data retained in the write data latch circuit 53 is written in the memory cell array within the writing time.

As a result of the data discriminating operation, data transfer operation and writing operation thus described, the data temporarily written in the memory cell array 51 is additionally written therein again, which guarantees the reliability in the data writing.

When the additional writing operation is thus implemented after the temporarily writing operation, which is a high-speed writing operation, in order to improve the writing reliability, an amount of time necessary for the data writing operation can be reduced, and the reliability in the data writing operation can be assured at the same time.

When a large volume of data is written at a high speed in the conventional EEPROM from the memory-controller side, there arise a too large number of memory blocks in the memory cell array already subjected to the temporary writing operation, which makes it difficult to secure an execution timing of the additional writing operation. As a result, the execution of the additional writing operation fails in some of the memory blocks, and the data writing performance cannot be as solid as expected, which deteriorates the writing reliability.

SUMMARY OF THE INVENTION

Therefore, a main object of the present invention is to provide a non-volatile memory control device capable of securing the timing of the execution of the additional writing operation even in the case where a large volume of data is written at a high speed, and thereby reducing the data writing time and assuring the writing reliability at the same time.

A non-volatile memory control device according to the present invention comprises a plurality of non-volatile memories each provided with a memory cell array divided into a plurality of memory blocks; and a memory controller for controlling writing operations in the respective non-volatile memories, wherein the non-volatile memory comprises a writing operation selector for selecting one of a temporary writing operation in which a writing operation in the memory cell array is completed at a high speed within a writing time shorter than a standard writing time and an additional writing operation in which a writing operation for writing the same data in the memory cell array as written in the temporary writing operation is completed within the standard writing time;

a writing time setter for setting a writing time necessary for the writing operation indicated by a result of the selection by the writing operation selector;

a writing controller for outputting a signal which rejects a writing operation for a period during which a temporary writing operation or an additional writing operation is being executed and a signal which allows a writing operation for a period during which a temporary writing operation or an additional writing operation is not being executed; and a writing status indicator for memorizing information indicating whether a memory block has undergone a temporary writing operation or an additional writing operation, and the memory controller comprises a writing instruction output unit for outputting a temporary writing instruction or an additional writing instruction to the non-volatile memory only when the signal which allows the writing operation is received from the writing controller thereof, and the memory controller outputs an additional writing instruction to a non-volatile memory arbitrarily selected via the writing instruction output unit when a signal which rejects a writing operation is not outputted from the writing controllers of the plurality of non-volatile memories for a certain period of time, and outputs a temporary writing instruction to another non-volatile memory at least once via the writing instruction output unit by the time when the additional writing operation is completed in the arbitrary non-volatile memory.

According to the present invention, an additional writing instruction is given to one of the non-volatile memories waiting for a writing operation, while a temporarily writing instruction is given to another non-volatile memory. More specifically, while an additional writing operation is being executed to one of the non-volatile memories, a temporary writing operation is executed at least once to another non-volatile memory. Accordingly, an amount of time in total necessary for the writing operations in the plurality of non-volatile memories can be cut down. The amount of time in total necessary for the writing operations in the plurality of non-volatile memories can be cut down further when the temporary writing operation is executed to one of the non-volatile memories at least twice while the additional writing operation is being executed to other non-volatile memory.

A non-volatile memory control device according to the present invention comprises:

a plurality of non-volatile memories each provided with a memory cell array divided into a plurality of memory blocks; and a memory controller for controlling writing operations in the respective non-volatile memories, wherein the non-volatile memory comprises:

a writing operation selector for selecting one of a temporary writing operation in which a writing operation in the memory cell array is completed at a high speed within a writing time shorter than a standard writing time and an additional writing operation in which a writing operation for writing the same data in the memory cell array as written in the temporary writing operation is completed within the standard writing time;

a writing time setter for setting a writing time necessary for the writing operation indicated by a result of the selection by the writing operation selector; and a writing status indicator for memorizing information indicating whether a memory block has undergone a temporary writing operation or an additional writing operation, and the memory controller comprises:

a writing status confirming unit for checking the status of the writing status indicator when the power-on of the device is detected; and a writing instruction output unit for outputting an additional writing instruction to the relevant non-volatile memory when the writing status confirming unit identifies a memory block in which a temporary writing operation has been completed through the writing status indicator.

In the constitution, when the power supply for the device is disconnected in the case where the temporary writing operation is already completed and the additional writing operation is not executed yet in one of the memory blocks, and the device is then powered on, the writing status confirming unit which detected the power-on of the device checks the status of the writing status indicator. When the writing status confirming unit identifies a memory block in which a temporary writing operation is already completed in the writing status indicator, the writing instruction output unit outputs an additional writing instruction to the relevant non-volatile memory. Accordingly, in the case where there is a memory block in which a temporary writing operation was already completed at the time of the previous power-off, the additional writing operation can be surely executed to the memory block.

A non-volatile memory control device according to the present invention comprises:

a plurality of non-volatile memories each provided with a memory cell array divided into a plurality of memory blocks; and a memory controller for controlling writing operations in the respective non-volatile memories, wherein the non-volatile memory comprises:

a writing operation selector for selecting one of a temporary writing operation in which the writing operation in the memory cell array is completed at a high speed within a writing time shorter than a standard writing time and an additional writing operation in which the writing operation for writing the same data in the memory cell array as written in the temporary writing operation is completed within the standard writing time, and the memory controller comprises a power-on detector for securing a certain period of waiting time corresponding to an additional writing time when the power-on the device is detected. Accordingly, the data temporarily written in the memory block in which the temporary writing operation is already completed when the device was powered-off can be surely additionally written therein.

A non-volatile memory control device according to the present invention comprises:

a plurality of non-volatile memories each provided with a memory cell array divided into a plurality of memory blocks; and a memory controller for controlling writing operations in the respective non-volatile memories, wherein the non-volatile memory comprises:

a writing operation selector for selecting one of a temporary writing operation in which the writing operation in the memory cell array is completed at a high speed within a writing time shorter than a standard writing time and an additional writing operation in which the writing operation for writing the same data in the memory cell array as written in the temporary writing operation is completed within the standard writing time;

a writing time setter for setting a writing time necessary for the writing operation indicated by a result of the selection by the writing operation selector; and a writing status indicator for memorizing information indicating whether a memory block has undergone a temporary writing operation or an additional writing operation, and the memory controller comprises:

a writing status confirming unit for checking the status of the writing status indicator when the power-off instruction of the device is detected; and a writing instruction output unit for outputting an additional writing instruction to the memory block in which the temporary writing operation is completed when the writing status confirming unit identifies the memory block in which the temporary writing operation is completed in the writing status indicator. Accordingly, the temporary writing data in the memory block in which the temporary writing operation is already completed when the power supply is disconnected can be surely additionally written therein.

A non-volatile memory control device according to the present invention comprises:

a plurality of non-volatile memories each provided with a memory cell array divided into a plurality of memory blocks; and a memory controller for controlling writing operations in the respective non-volatile memories, wherein the non-volatile memory comprises:

a writing operation selector for selecting one of a temporary writing operation in which the writing operation in the memory cell array is completed at a high speed within a writing time shorter than a standard writing time and an additional writing operation in which the writing operation for writing the same data in the memory cell array as written in the temporary writing operation is completed within the standard writing time, and the memory controller comprises a power-off detector for securing a certain waiting time corresponding to an additional writing time when the power-off of the device is detected. Accordingly, the data temporarily written in the memory block in which the temporary writing operation is already completed when the power is disconnected can be surely additionally written therein.

A non-volatile memory control device according to the present invention comprises:

a plurality of non-volatile memories each provided with a memory cell array divided into a plurality of memory blocks; and a memory controller for controlling writing operations in the respective non-volatile memories, wherein the non-volatile memory comprises:

a writing operation selector for selecting one of a temporary writing operation in which the writing operation in the memory cell array is completed at a high speed within a writing time shorter than a standard writing time and an additional writing operation in which the writing operation for writing the same data in the memory cell array as written in the temporary writing operation is completed within the standard writing time;

a writing time setter for setting a writing time necessary for the writing operation indicated by a result of the selection by the writing operation selector; and a writing status indicator for memorizing information indicating whether a memory block has undergone a temporary writing operation or an additional writing operation, and the memory controller comprises a waiting time managing unit for writing an execution time of the temporary writing operation of a memory block in the memory block, reading the execution time from the memory block in which the temporary writing operation is completed when the memory block in which the temporary writing operation is completed is identified by the writing status indicator, and confirming a waiting time after the temporary writing operation in the memory block in which the temporary writing operation is completed, and the waiting time managing unit allows the additional writing operation to be executed in a memory block in which the temporary writing operation is completed when the waiting time of the memory block is at least a certain amount of time. Accordingly, the data temporarily written in the memory block which waited for the additional writing operation for at least a certain amount of time can be surely additionally written therein prior to the other memory blocks.

A non-volatile memory control device according to the present invention comprises:

a plurality of non-volatile memories each provided with a memory cell array divided into a plurality of memory blocks; and a memory controller for controlling writing operations in the respective non-volatile memories, wherein the non-volatile memory comprises:

a writing operation selector for selecting one of a temporary writing operation in which the writing operation in the memory cell array is completed at a high speed within a writing time shorter than a standard writing time and an additional writing operation in which the writing operation for writing the same data in the memory cell array as written in the temporary writing operation is completed within the standard writing time;

a writing time setter for setting a writing time necessary for the writing operation indicated by a result of the selection by the writing operation selector; and a writing status indicator for memorizing information indicating whether a memory block has undergone a temporary writing operation or an additional writing operation, and the memory controller writes an execution order of the temporary writing operation of a memory block in the memory block, reads the execution order of the memory block in which the temporary writing operation is completed when the memory block in which the temporary writing operation is completed is identified in the writing status indicator, and executes the additional writing operation in the memory block in which the temporary writing operation is completed based on the read execution order. Accordingly, even though it may not be possible to assure a sufficient amount of time for the additional writing operation, the data can be additionally written with a priority given to the memory block whose waiting time is longer than that of the other blocks prior to the other memory blocks.

A non-volatile memory control device according to the present invention comprises:

a plurality of non-volatile memories each provided with a memory cell array divided into a plurality of memory blocks; and a memory controller for controlling writing operations in the respective non-volatile memories, wherein the non-volatile memory comprises:

a writing operation selector for selecting one of a temporary writing operation in which the writing operation in the memory cell array is completed at a high speed within a writing time shorter than a standard writing time and an additional writing operation in which the writing operation for writing the same data in the memory cell array as written in the temporary writing operation is completed within the standard writing time;

a writing time setter for setting a writing time necessary for the writing operation indicated by a result of the selection by the writing operation selector; and a writing status indicator for memorizing information indicating whether a memory block has undergone a temporary writing operation or an additional writing operation, and the memory controller comprises:

a waiting time managing unit for writing an execution time of the temporary writing operation of a memory block in the memory block, reading the execution time from the memory block in which the temporary writing operation is completed when the memory block in which the temporary writing operation is completed is identified by the writing status indicator, and checking a waiting time after the temporary writing operation in the memory block in which the temporary writing operation is completed based on the read execution time; and an additional writing operation prohibiting unit for halting or prohibiting the additional writing operation in a memory block in which the waiting time is below a certain amount of time.

Accordingly, a writing durability, which may be deteriorated as the additional writing operation is executed more often, can last longer, and the reliability and service life can be thereby improved. In the case where it is unnecessary to retain the data for a long period of time in view of the conditions of the memory block and the contents of the data, the additional writing operation is not executed. As a result, the writing durability, which may be deteriorated as the additional writing operation is executed more often, can last longer, and the reliability and service life can be thereby improved.

According to the present invention, the execution timing of the additional writing operation can be assured even in the case where a large number of data is written at a high speed. As a result, the amount of time necessary for the memory controller to write the data in the non-volatile memories can be reduced, and the reliability and service life can be improved at the same time.

The non-volatile memory control device according to the present invention is advantageous in that the reduction of an amount of time necessary for data writing and improvements of the reliability and service life can be both achieved in a non-volatile memory (flash non-volatile memory, SD card memory, etc.).

BRIEF DESCRIPTION OF THE DRAWINGS

These and other objects as well as advantages of the invention will become clear by the following description of preferred embodiments of the invention and be specified in the claims attached hereto. A number of benefits not recited in this specification will come to the attention of the skilled in the art upon the implementation of the present invention.

DETAILED DESCRIPTION OF THE INVENTION

Hereinafter, preferred embodiments of the present invention are described referring to the drawings.

Preferred Embodiment 1

Figure 1:
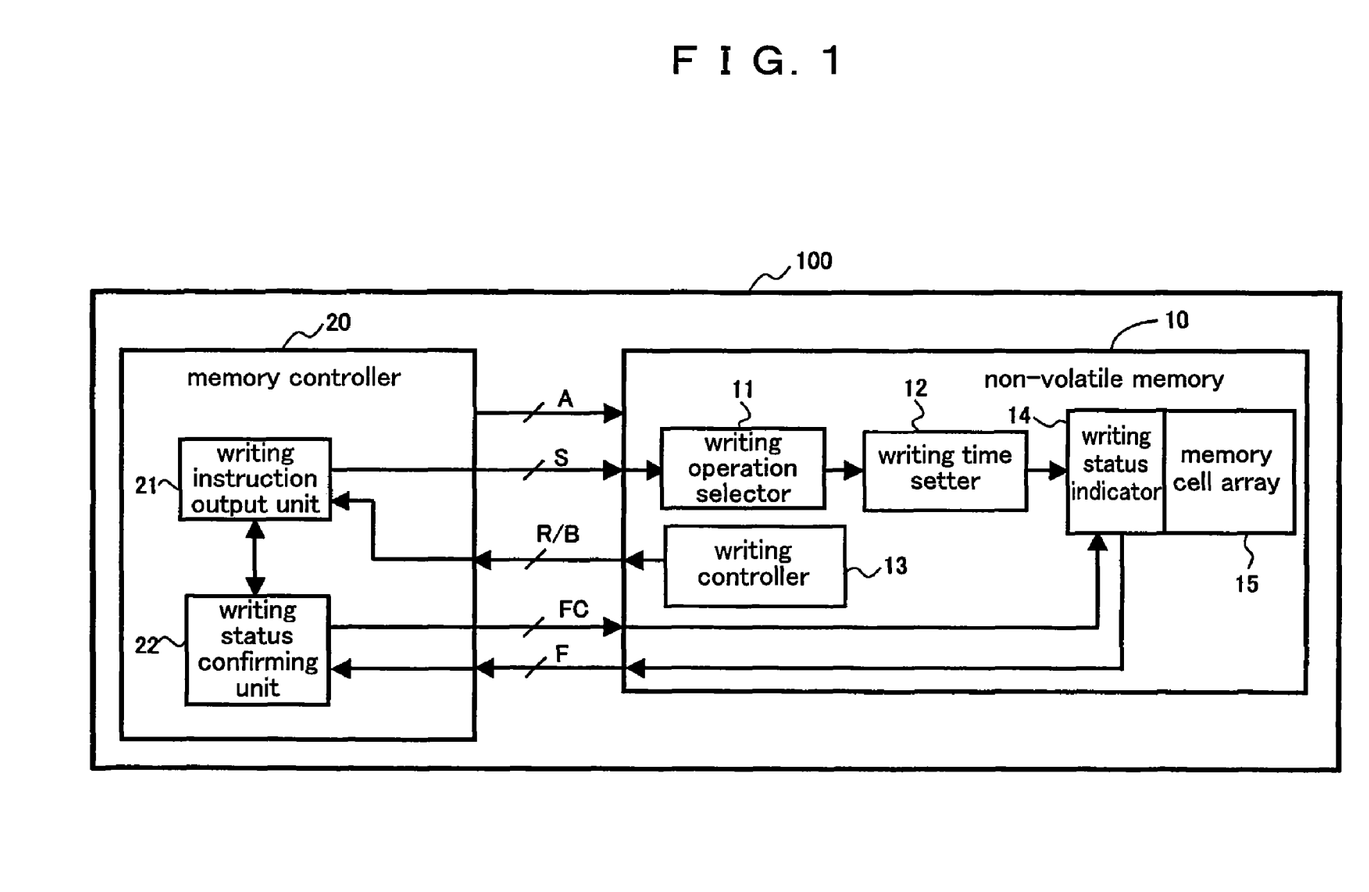
FIG. 1 is a block diagram illustrating a constitution of a non-volatile memory control device according to a preferred embodiment 1 of the present invention.

FIG. 1 is a block diagram illustrating a constitution of a non-volatile memory control device 100 according to a preferred embodiment 1 of the present invention. The non-volatile memory control device 100 according to the preferred embodiment 1 comprises a non-volatile memory 10, such as EEPROM, and a memory controller 20 which controls a writing operation in the non-volatile memory 10. The non-volatile memory 10 comprises a memory cell array divided into a plurality of memory blocks.

The non-volatile memory 10 comprises a writing operation selector 11, a writing time setter 12, a writing controller 13, a writing status indicator 14, and a memory cell array 15. A temporary writing instruction or an additional writing instruction is inputted to the writing operation selector 11 from the memory controller 20. The writing operation selector 11 selects one of a temporary writing operation in which data is written in the memory cell array 15 at a high speed within a writing time shorter than a standard writing time and an additional writing operation in which the same data as the write data in the temporary writing operation is written in the memory cell array 15 within the standard writing time based on the inputted instruction. The standard writing time is a normal writing time which guarantees the writing reliability (for example, 10 ms), and the writing time shorter than the standard operation time is, for example, 1 ms, which is a short length of time that stays in a single-digit number in comparison to the normal writing time of a two-digit number.

The writing time setter 12 sets an amount of time necessary for the temporary writing operation or the additional writing operation in accordance with a result of the selection by the writing operation selector 11. The writing controller 13 outputs a signal (ready signal) which allows the writing operation during a period over which the temporary writing operation or the additional writing operation is not being executed to a writing instruction output unit 21 in the memory controller 20. Further, the writing controller 13 outputs a signal (busy signal) which rejects the writing operation during a period over which the temporary writing operation or the additional writing operation is being executed to a writing instruction output unit 21. The writing status indicator 14 temporarily memorizes a writing status flag for each of the memory blocks in the memory cell array 15 in the non-volatile memory 10, indicating that its writing status indicates whether the temporary writing operation or the additional writing operation has been completed.

The memory controller 20 comprises the writing instruction output unit 21 and a writing status confirming unit 2. The writing instruction output unit 21 outputs the temporary writing instruction or the additional writing instruction described earlier to the writing operation selector 11. The function of the writing instruction output unit 21 is described in a more detailed manner. The writing instruction output unit 21 checks the output of the writing controller 13 when it is ready to output the temporary writing instruction or the additional writing instruction to the writing operation selector 11. When the output of the writing controller 13 indicates according to the check result that the writing operation is allowed, the writing instruction output unit 21 outputs the writing instruction to the writing operation selector 11. When the output state of the writing controller 13 indicates according to the check results that the writing operation is rejected, the writing instruction output unit 21 does not output the writing instruction to the writing operation selector 11. The writing status confirming unit 22 outputs a writing status confirmation instruction to the writing status indicator 14 of the non-volatile memory 10. Further, the writing status confirming unit 22 reads the writing status flag of the writing status indicator 14 (which shows whether the temporary writing operation or the additional writing operation has been completed).

Next, an operation of the non-volatile memory control device 100 according to the present preferred embodiment thus constituted is described. The writing controller 13, upon the confirmation that the writing operation is not being executed in the memory block of the memory cell array 15, outputs the ready signal which allows the writing operation to the writing instruction output unit 21. On the other hand, the writing controller 13, upon the confirmation that the writing operation is being executed in the memory block of the memory cell array 15, outputs the busy signal which rejects the writing operation to the writing instruction output unit 21.

When the temporary writing operation, in which the data is written at a high speed, is about to be executed to the memory block, the writing instruction output unit 21 checks the status of the writing controller 13. When a result of the check indicates the rejection of the writing operation, the writing instruction output unit 21 holds back for the output of the temporary writing operation.

It is assumed that the status of the writing controller 13 indicates that the writing operation is allowed. A situation in which the writing operation is allowed can be known from the fact that a bus line R/B from the writing controller 13 is at "H" level, and the "H" level continues for at least a certain period of time τ. The writing instruction output unit 21 outputs the temporary writing instruction to an address selected by an address bus A via a bus line S. The writing time setter 12 sets a relatively short writing time in accordance with settings of the temporary writing operation which is a high-speed writing operation. When the temporary writing operation starts, the writing controller 13 sets the rejection of the writing operation to the memory block targeted for the writing operation. Accordingly, any writing operation to be subsequently executed to the memory block targeted for the writing operation is restricted. Upon the completion of the temporary writing operation, the writing status indicator 14 temporarily memorizes the writing status flag of the memory block targeted for the writing operation indicating that the temporary writing operation is completed.

Next, the writing instruction output unit 21 outputs the additional writing instruction, which is a reliable writing operation, to the memory block targeted for the writing operation in which a temporary writing operation is completed. At that time, the writing instruction output unit 21 checks the status of the writing controller 13. When the check result indicates the rejection of the writing operation in the writing controller 13, the writing instruction output unit 21 holds back the output of the additional writing instruction. When the check result shows that the writing operation is allowed, the writing instruction output unit 21 outputs the additional writing instruction. At that time, the writing time setter 12 sets a relatively long writing time in accordance with settings of the additional writing operation which is a reliable writing operation. When the additional writing operation starts, the writing controller 13 sets the rejection of the writing operation in the memory block targeted for the writing operation. Accordingly, the writing operation to be subsequently executed to the memory block targeted for the writing operation is restricted.

In the present preferred embodiment, the additional writing operation is executed in a time zone when the memory block targeted for the writing operation is waiting for the writing operation. Accordingly, in the memory controller 20, an amount of time necessary for waiting for the additional writing operation is reduced.

The writing status confirming unit 22 outputs a writing status confirmation instruction FC to the writing status indicator 14 at an arbitrary timing whenever necessary to thereby check a writing status flag F for each of the memory blocks in the memory cell array 15. Accordingly, the writing status confirming unit 22 can easily check, whenever necessary, whether the writing status in each of the memory blocks shows the completion of the temporary writing operation or the additional writing operation. The writing status indicator 14 outputs "H" level as the writing status flag F in the case where the memory block is in the execution of the temporary writing operation. The writing status confirming unit 22, which received the writing status flag F="H", notifies the writing instruction output unit 21 of the reception of the flag. The writing instruction output unit 21, which was notified of the writing status flag F showing "H", outputs the additional writing instruction to the memory block, and the non-volatile memory 10 executes the additional writing operation to the memory block of the memory cell array 15.

As described, the present preferred embodiment can avoid such a disadvantageous situation that the execution of the additional writing operation fails in some memory blocks because the temporary writing operation is completed in a too large number of memory blocks when a large volume of data is written at a high speed in the memory cell array 15. As a result, the reduction of the necessary data-writing time and the assurance of the reliability of data writing can be both achieved.

Preferred Embodiment 2

Figure 2:
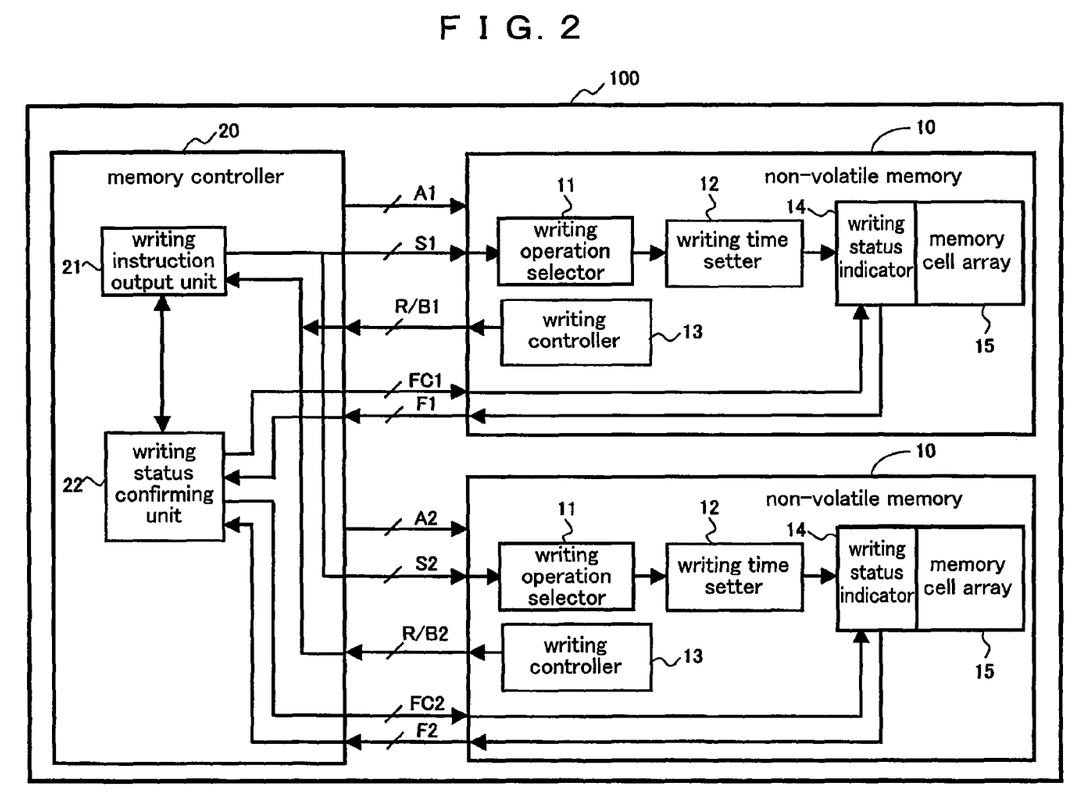
FIG. 2 is a block diagram illustrating a constitution of a non-volatile memory control device according to a preferred embodiment 2 of the present invention.

FIG. 2 is a block diagram illustrating a constitution of a non-volatile memory control device 100 according to a preferred embodiment 2 of the present invention. In FIG. 2, the same reference symbols as those shown in FIG. 1 (preferred embodiment 1) denote the same constituent elements. The non-volatile memory control device 100 according to the present preferred embodiment comprises m number of non-volatile memories 10 (m is an arbitrary natural number). It is assumed that there are n number (n is an arbitrary natural number which satisfies m>n) of non-volatile memories 10 to which the rejection of the writing operation is not outputted from the writing controller 13 for at least a certain period of time. In the assumed case, the writing instruction output unit 21 outputs the additional writing instruction to a non-volatile memory 10 arbitrarily selected, and thereafter outputs the temporary writing instruction to another non-volatile memory 10 by the time when that additional writing operation is completed (completion time point). Thus, the additional writing instruction is given to a non-volatile memory 10, while the temporary writing instruction is given to another, both waiting for the writing operation. Accordingly, even in a period during which the additional writing operation is executed to one of the non-volatile memories 10, the temporary writing operation can be executed to another at least once. As a result, the length of time necessary for the writing operation in total with respect to the plurality of non-volatile memories 10 can be shortened.

The temporary writing operation may be executed to one of the non-volatile memories 10 at least twice during a period over which the additional writing operation is executed to another. As a result, the length of time necessary for the writing operation in total with respect to the plurality of non-volatile memories 10 can be further shortened.

Figure 3A:
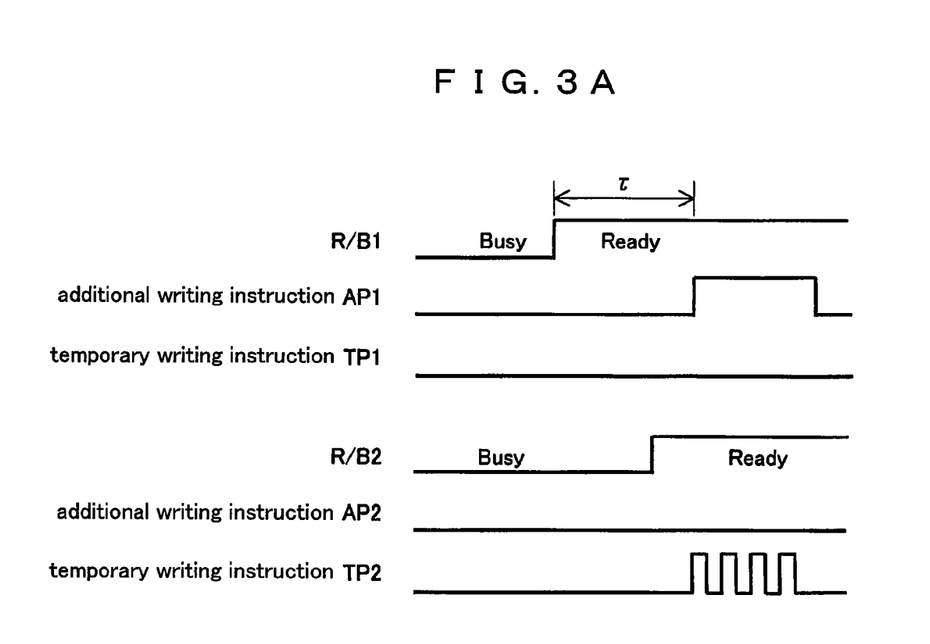
FIGS. 3A and 3B are timing charts illustrating an operation of the non-volatile memory control device according to the preferred embodiment 2.
Figure 3B:
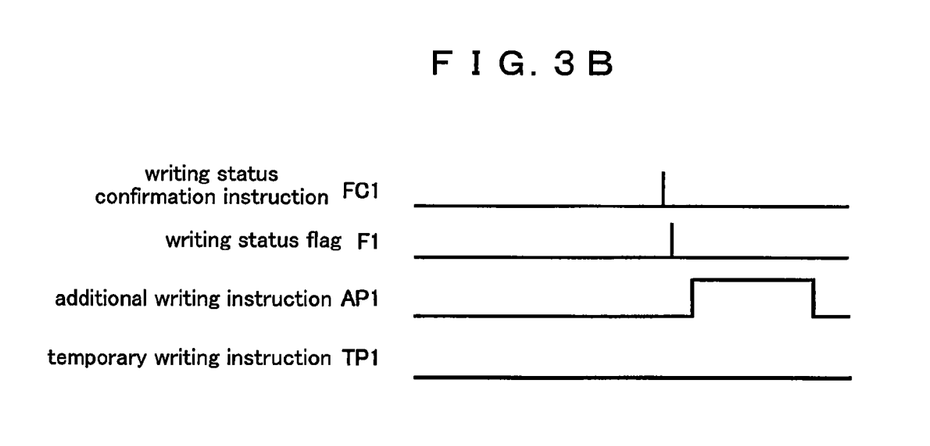

The control operation according to the present preferred embodiment is specifically described referring to FIGS. 3A and 3B. First, the control operation based on bus lines is described. It is assumed that a bus line R/B1 in the upper non-volatile memory 10 reaches "H" level, and the "H" level continues for at least a certain period of time τ as shown in FIG. 3A. Then, the writing instruction output unit 21 outputs an additional writing instruction AP1 to an upper non-volatile memory 10 via a bus line S1 so that the additional writing operation is executed in the upper non-volatile memory 10.

It is assumed that a bus line R/B2 in a lower non-volatile memory 10 reaches "H" level while an additional writing operation is in execution in the upper non-volatile memory 10 and the memory controller 20 is waiting for an additional writing operation. Then, the writing instruction output unit 21 outputs a temporary writing instruction TP2 to the lower non-volatile memory 10 via the bus lines R/B2 so that a temporary writing operation is executed in the lower non-volatile memory 10.

Next, a writing control operation based on a writing status confirmation instruction is described. A writing control operation based on a writing status confirmation instruction and a temporary writing control operation can be similarly executed; therefore, a writing control operation based on a writing status confirmation instruction is described. As shown in FIG. 3B, the memory controller 20 outputs a writing status confirmation instruction FC1 to an upper non-volatile memory 10. The upper non-volatile memory 10 outputs "H" level as a writing status flag F1 in the case where a selected memory block is in execution of a temporary writing operation. The writing instruction output unit 21 in the memory controller 20 receives the writing status flag F1="H", and outputs an additional writing instruction AP11 to the upper non-volatile memory 10 so that the additional writing operation is executed therein.

Preferred Embodiment 3

Figure 4:
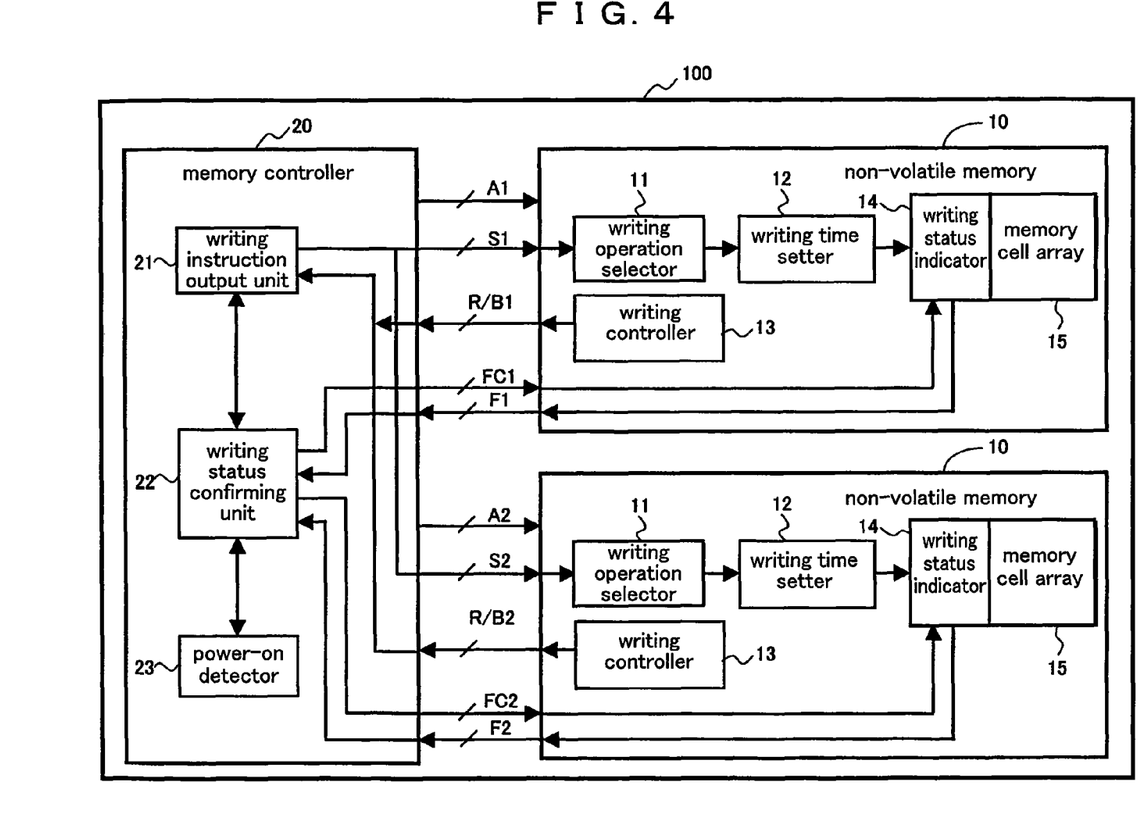
FIG. 4 is a block diagram illustrating a constitution of a non-volatile memory control device according to a preferred embodiment 3 of the present invention.

FIG. 4 is a block diagram illustrating a constitution of a non-volatile memory control device 100 according to a preferred embodiment 3 of the present invention. In FIG. 4, the same reference symbols as those shown in FIG. 2 (preferred embodiment 2) denote the same constituent elements. In the non-volatile memory control device 100 according to the present preferred embodiment, the memory controller 20 further comprises a power-on detector 23 for detecting the power-on of the device. The power-on detector 23 activates the writing status confirming unit 22 upon the detection of the power-on of the device. When the activated writing status confirming unit 22 identifies a memory block in which a temporary writing operation is completed but an additional writing operation is not executed yet, the power-on detector 23 activates the writing instruction output unit 21 so that the additional writing instruction is outputted therefrom.

It is assumed that the device is powered off in the state where a temporary writing operation is completed but an additional writing operation is not executed in one of the memory blocks in the non-volatile memory 10 arbitrarily selected and the device is powered on again. In the assumed case, the power-on detector 23 detects the power-on of the device, and activates the writing status confirming unit 22. The activated writing status confirming unit 22 checks the writing status indicator 14 in each of the non-volatile memories 10. When the writing status confirming unit 22 identifies a memory block in which the temporary writing operation is completed but the additional writing operation is yet to be executed as a result of the check, a predetermined waiting time is provided. As the waiting time, 1 ms or more is suitable. The power-on detector 23 activates the writing instruction output unit 21 during the waiting time so that the additional writing instruction is outputted therefrom.

According to the present preferred embodiment, in the case where a temporary writing operation was completed in any of the memory blocks at the time of the previous power-off, an additional writing operation can be reliably executed in the memory block.

Preferred Embodiment 4

Figure 5:
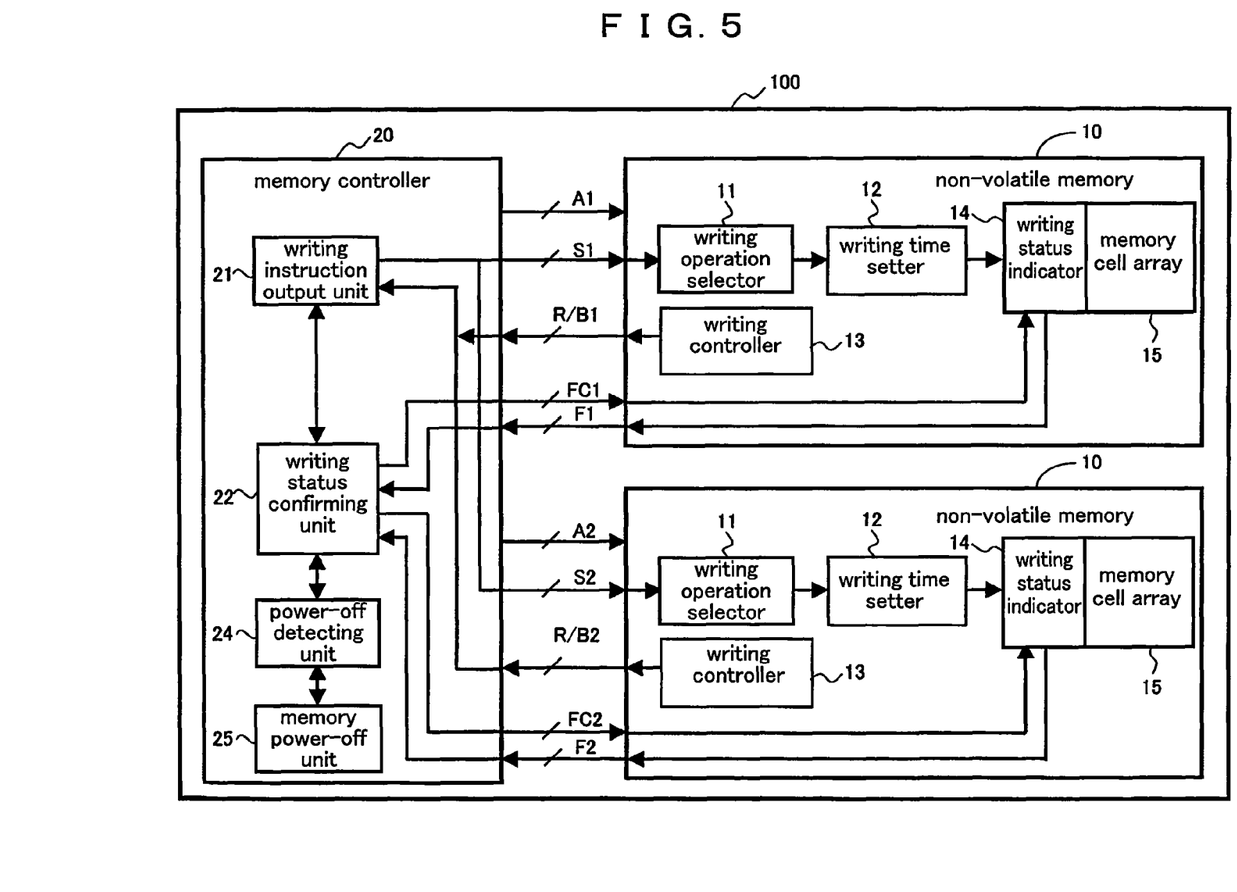
FIG. 5 is a block diagram illustrating a constitution of a non-volatile memory control device according to a preferred embodiment 4 of the present invention.

FIG. 5 is a block diagram illustrating a constitution of a non-volatile memory control device 100 according to a preferred embodiment 4 of the present invention. In FIG. 5, the same reference symbols as those shown in FIG. 2 (preferred embodiment 2) denote the same constituent elements. In the non-volatile memory control device 100 according to the present preferred embodiment, the memory controller 20 further comprises a power-off detecting unit 24 which detects a power-off instruction for the device and a memory power-off unit 25. When the power-off detecting unit 24 detects the power-off instruction of the device, a predetermined waiting time is provided. As the waiting time, 1 ms or more is suitable. The power-off detecting unit 24 activates the writing status confirming unit 22 during the waiting time previous to power-off of the device. When the activated writing status confirming unit 22 identifies a memory block in which a temporary writing operation is completed but an additional writing operation is yet to be executed, the power-off detecting unit 24 activates the writing instruction output unit 21 so that the additional writing instruction is outputted therefrom. Furthermore, the memory power-off unit 25 prohibits the execution of the power-off instruction and retains the power supply until the additional writing operation is completed, and allows the execution of the power-off instruction when the additional writing operation is completed.

According to the present preferred embodiment, when the power-off instruction is issued before an additional writing operation to be executed subsequent to a temporary writing operation is completed, the additional writing operation is forcibly executed, and then, the power supply is disconnected. As a result, the data temporarily written in a memory block can be reliably additionally written therein before the power supply is disconnected.

Preferred Embodiment 5

Figure 6:
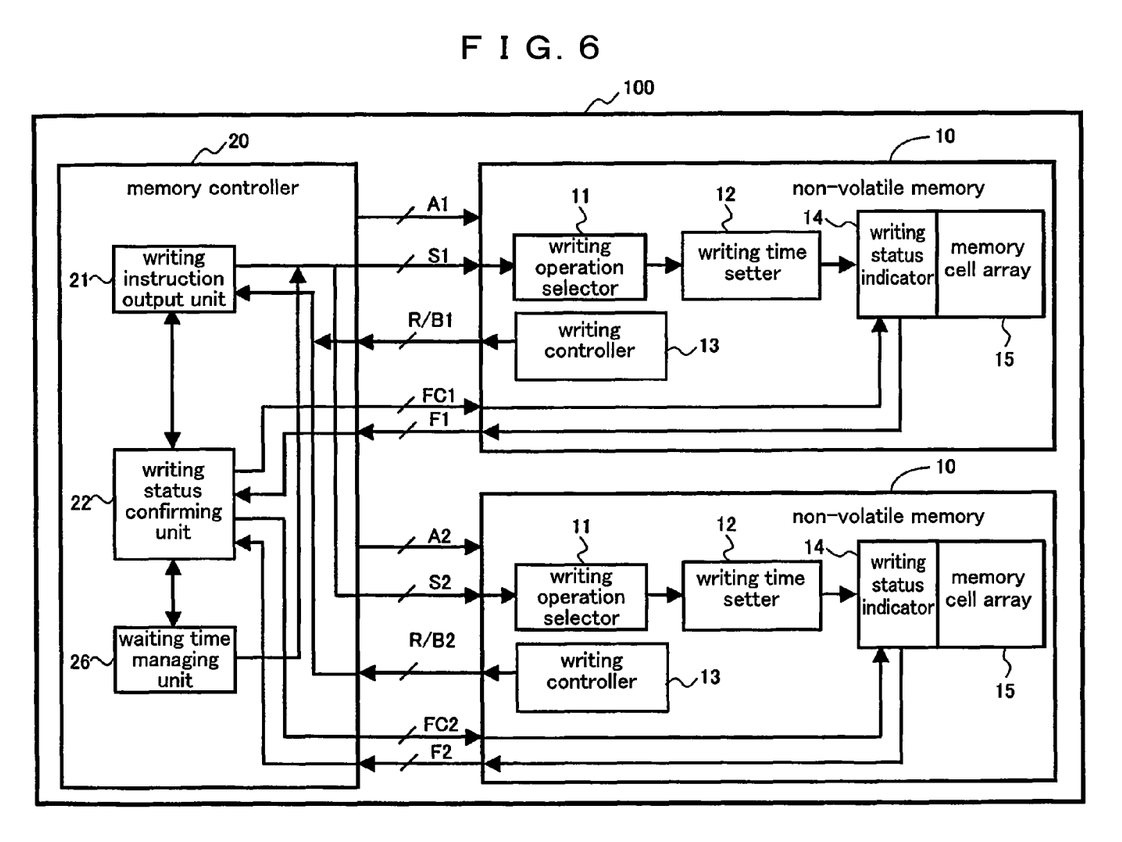
FIG. 6 is a block diagram illustrating a constitution of a non-volatile memory control device according to a preferred embodiment 5 of the present invention.

FIG. 6 is a block diagram illustrating a constitution of a non-volatile memory control device 100 according to a preferred embodiment 5 of the present invention. In FIG. 6, the same reference symbols as those shown in FIG. 2 (preferred embodiment 2) denote the same constituent elements. In the non-volatile memory control device 100 according to the present preferred embodiment, the memory controller 20 further comprises a waiting time managing unit 26. The waiting time managing unit 26 writes information relating to an execution time of a temporary writing operation of a memory block in which a temporary writing operation is completed but an additional writing operation is not executed yet in each of such memory blocks. When the writing status confirming unit 22 identifies a memory block in which a temporary writing operation is completed but an additional writing operation is not executed yet, the waiting time managing unit 26 reads the information relating to the execution time of the temporary writing operation from the memory block, and checks a waiting time after the temporary writing operation. The writing instruction output unit 21 outputs an additional writing instruction to a memory block whose waiting time after the temporary writing operation is judged to be at least a certain period of time by the waiting time managing unit 26.

Thus constituted, a priority is given to a memory block which waited for the additional writing operation for at least a certain period of time, and the data temporarily written can be reliably additionally written therein.

The writing instruction output unit 25 may halt the output of an additional writing instruction to a memory block whose waiting time after a temporary writing operation is judged to be below the certain period of time by the waiting time managing unit 26. Thus constituted, a writing durability, which may be deteriorated as additional writing operations are executed more often, can last longer, and the reliability and service life can be thereby improved.

Preferred Embodiment 6

Figure 7:
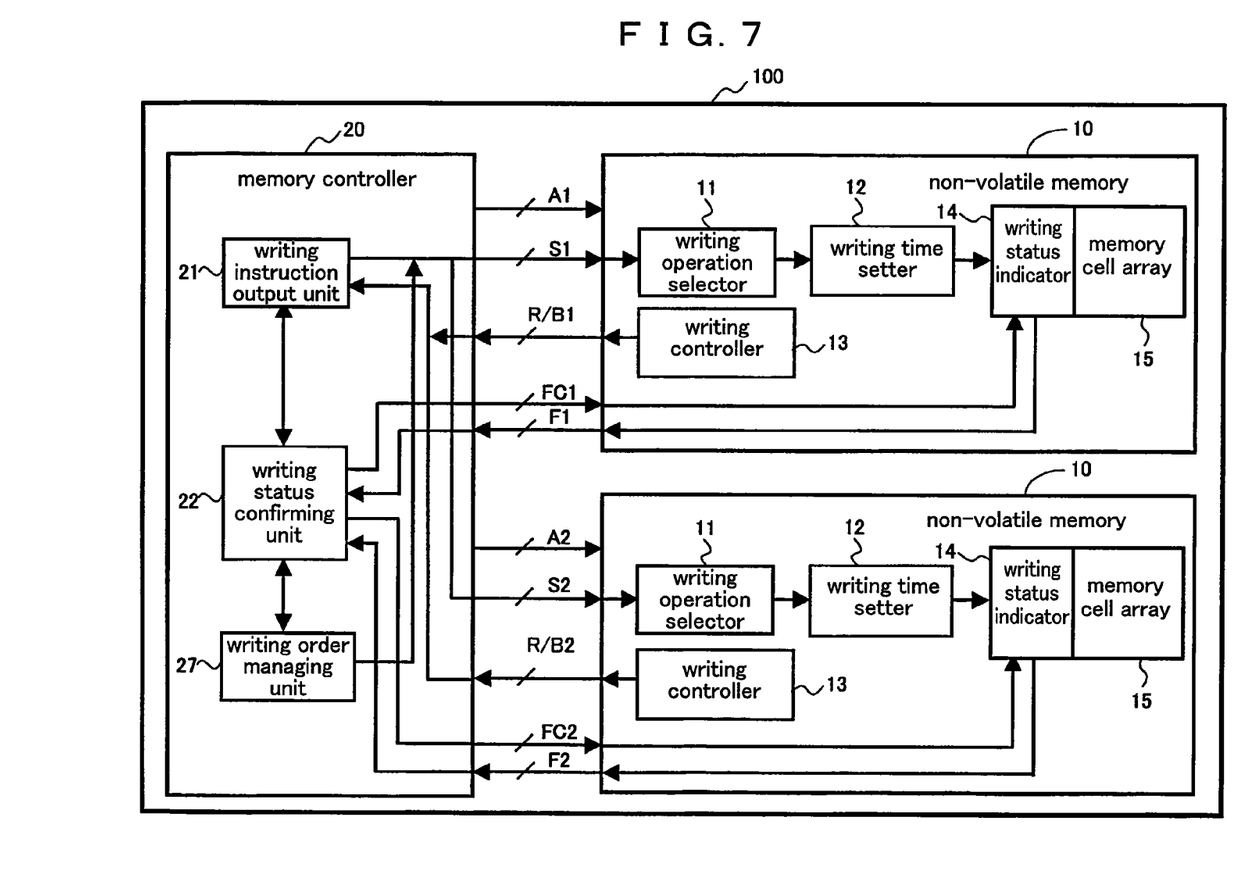
FIG. 7 is a block diagram illustrating a constitution of a non-volatile memory control device according to a preferred embodiment 6 of the present invention.

FIG. 7 is a block diagram illustrating a constitution of a non-volatile memory control device 100 according to a preferred embodiment 6 of the present invention. In FIG. 7, the same reference symbols as those shown in FIG. 2 (preferred embodiment 2) denote the same constituent elements. The non-volatile memory control device 100 according to the present preferred embodiment further comprises a writing order managing unit 27. The writing order managing unit 27 writes information relating to an execution order of the temporary writing operation of a memory block in which the temporary writing operation is completed but the additional writing operation is not executed yet in the relevant memory block. When the writing status confirming unit 22 identifies a group of memory blocks in which the temporary writing operation is completed but the additional writing operation is not executed yet, the writing order managing unit 27 reads the information relating to the execution order of temporary writing operations from each memory blocks of the group and transmits the read information to the writing instruction output unit 25. The writing instruction output unit 25 outputs additional writing instructions to the memory blocks in which the temporary writing operation is completed but the additional writing operation is not executed yet identified by the writing order managing unit 27 in such a manner that a memory block whose execution time of the temporary writing operation is chronologically earlier is prioritized.

According to the present preferred embodiment, the data in a memory block whose waiting time is longer can be additionally written prior to data in other memory blocks even in the case where the length of time secured for additional writing operations may not be long enough.

Preferred Embodiment 7

Figure 8:
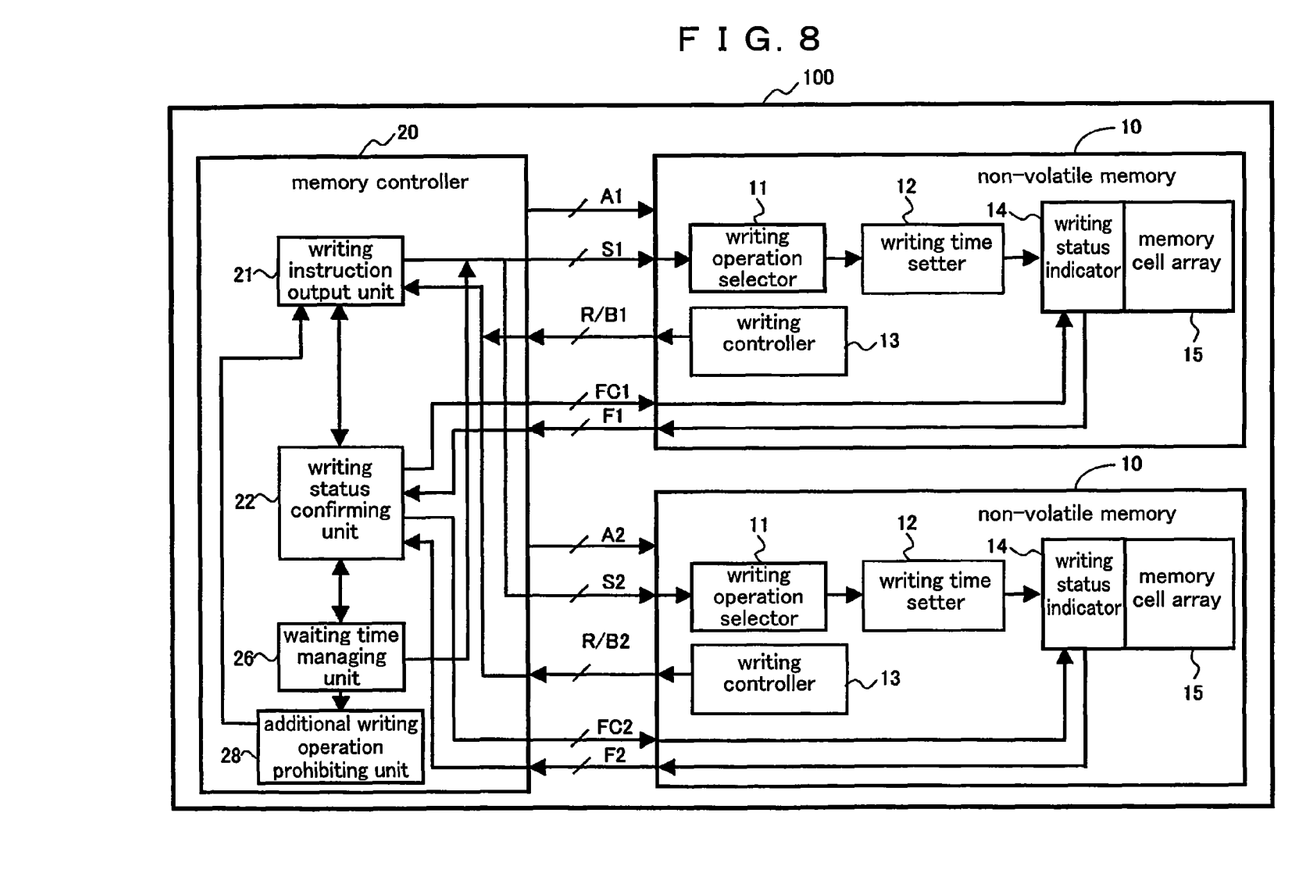
FIG. 8 is a block diagram illustrating a constitution of a non-volatile memory control device according to a preferred embodiment 7 of the present invention.

FIG. 8 is a block diagram illustrating a constitution of a non-volatile memory control device 100 according to a preferred embodiment 7 of the present invention. In FIG. 8, the same reference symbols shown in FIG. 8 as those shown in FIG. 2 (preferred embodiment 2) denote the same constituent elements. The non-volatile memory control device 100 according to the present preferred embodiment further comprises a waiting time managing unit 26 and an additional writing operation prohibiting unit 28. The waiting time managing unit 26 writes information relating to the execution time of a temporary writing operation of a memory block in which a temporary writing operation is completed but an additional writing operation is not executed yet in each of such memory blocks. When the writing status confirming unit 22 identifies a memory block in which a temporary writing operation is completed but an additional writing operation is not executed yet, the waiting time managing unit 26 reads information relating to the execution time of the temporary writing operation from the memory block and checks the waiting time after the temporary writing operation. The additional writing operation prohibiting unit 28 prohibits the additional writing operation in a memory block whose waiting time is judged to be below a certain amount of time by the waiting time managing unit 26. The additional writing operation prohibiting unit 28 prohibits additional writing operations separately for each of memory blocks.

According to the present preferred embodiment, the additional writing operation is not executed in the case where it is unnecessary to retain data for a long period of time depending on a memory block or the contents of the data. Accordingly, the writing durability, which may be deteriorated as additional writing operations are executed more often, can last longer, and the reliability and service life can be thereby improved.

While there has been described what is at present considered to be preferred embodiments of this invention, it will be understood that various modifications may be made therein, and it is intended to cover in the appended claims all such modifications as fall within the true spirit and scope of this invention.

What is claimed is:

1. A non-volatile memory control device comprising:
   a non-volatile memory; and
   a memory controller for controlling a writing operation in the non-volatile memory, wherein
   the non-volatile memory comprises:
   a writing operation selector for selecting one of a first writing operation in which a data is written in a memory cell array within a first writing time in response to reception of a first writing command and a second writing operation in which the data is written in the memory cell array within a second writing time in response to receipt of a second writing command; and
   a writing controller for outputting a signal that rejects the writing operation to the memory controller when the first or second writing operation is currently carried out and outputting a signal that allows the writing operation to the memory controller when neither the first writing operation nor the second writing operation is currently carried out, and
   the first writing time is shorter than the second writing time, and
   the memory controller outputs the first writing command or the second writing command to the writing operation selector as far as the writing operation is allowed by the writing controller, and the memory controller does not output the first writing command or the second writing command to the writing operation selector in the case where the writing operation is currently rejected by the writing controller.

2. The non-volatile memory control system as claimed in claim 1, wherein
   the non-volatile memory further comprises a writing status indicator for storing a writing status to indicate whether the first writing operation is completed or the second writing operation is completed, for each memory block in the memory cell array of the non-volatile memory.

3. The non-volatile memory control system as claimed in claim 2, wherein
   the memory controller further comprises a writing status confirming device for confirming the writing status stored in the writing status indicator by discretionary timings.

* * * * *